United States Patent
Piepenstock et al.

(10) Patent No.: US 8,653,856 B2
(45) Date of Patent: Feb. 18, 2014

(54) ELECTRONIC DEVICE AND METHOD FOR BUFFERING

(75) Inventors: Oliver Piepenstock, Hannover (DE); Andreas Bock, Isernhagen (DE); Bhavesh G. Bhakta, Richardson, TX (US)

(73) Assignees: Texas Instruments Incorporated, Dallas, TX (US); Texas Instruments Deutschland GmbH, Freising (DE)

( * ) Notice: Subject to any disclaimer, the term of this patent is extended or adjusted under 35 U.S.C. 154(b) by 297 days.

(21) Appl. No.: 13/234,318

(22) Filed: Sep. 16, 2011

(65) Prior Publication Data

US 2012/0074987 A1 Mar. 29, 2012

(30) Foreign Application Priority Data

Sep. 28, 2010 (DE) .......................... 10 2010 046 686

(51) Int. Cl.
*H03K 19/094* (2006.01)
*H03B 1/00* (2006.01)

(52) U.S. Cl.
USPC ............. 326/86; 326/115; 326/121; 326/126; 326/127; 327/108; 327/112

(58) Field of Classification Search
USPC ......... 326/86, 82, 83, 87, 115, 126, 121, 127; 327/108, 112, 65; 330/253, 258
See application file for complete search history.

(56) References Cited

U.S. PATENT DOCUMENTS

| | | | | |
|---|---|---|---|---|
| 6,856,178 | B1* | 2/2005 | Narayan | 327/108 |
| 6,992,508 | B2* | 1/2006 | Chow | 326/86 |
| 7,598,779 | B1 | 10/2009 | Wang et al. | |
| 2003/0094977 | A1* | 5/2003 | Li et al. | 327/65 |
| 2003/0193350 | A1 | 10/2003 | Chow | |
| 2005/0285629 | A1* | 12/2005 | Hein et al. | 326/115 |
| 2007/0024320 | A1 | 2/2007 | De Laurentiis et al. | |

OTHER PUBLICATIONS

DE Search Report mailed Jun. 6, 2011.

* cited by examiner

*Primary Examiner* — Vibol Tan
(74) *Attorney, Agent, or Firm* — Alan A. R. Cooper; W. James Brady, III; Frederick J. Telecky, Jr.

(57) ABSTRACT

A buffer is provided. The buffer includes a first switch and a second switch coupled in series at a first output node, a third switch and a fourth switch coupled in series at a second output node, a first current source and a second current source. The first current source is coupled with one side to the first switch and the third switch and with another side to a first supply voltage, the second current source is coupled with one side to the second switch and the fourth switch and with a second side to a second supply voltage. The first current source is configured to adjust an output swing in a first operation mode and in a second operation. The second current source is configured to adjust a common mode voltage level of the output signal in the first operation mode and to provide maximum series resistance in the second operation mode.

16 Claims, 8 Drawing Sheets

ELECTRONIC DEVICE AND METHOD FOR BUFFERING

CROSS-REFERENCE TO RELATED APPLICATIONS

This application is claims priority from German Patent Application No. 10 2010 046 686.7, filed Sep. 28, 2010, which is hereby incorporated by reference for all purposes.

TECHNICAL FIELD

The invention relates to an electronic device including a configurable buffer.

BACKGROUND

Various electronic systems require high quality clock synthesis, clock distribution and data transmission networks. Many standards specify clock and data formats for accommodating the needs of the different systems in terms of the signal properties, as for example voltage swing, clock frequency and edge speed. Commonly used standards for clock distribution and data transmission are for example high current steering logic (HCSL), low voltage differential swing (LVDS), current switch mode logic (CML) and low voltage CMOS (LVCMOS). HCSL, CML and LVDS use differential signaling while LVCMOS uses single-ended rail-to-rail signaling. For each of the existing standards, different buffer types are employed. Several different circuit topologies, which are commonly used for implementing LVDS output buffers are, for example described in Bratov et al., "Architecture and Implementation of a Low-Power LVDS Output Buffer for High-Speed Applications," *IEEE Trans. on Circuits and Systems—I: Regular Papers*, Vol. 53, No. 10, October 2006. The other standards may also use several different architectures and configurations.

In order to the reduce chip area and the pin count while increasing flexibility, it is desirable to provide electronic devices with output buffers, that accommodate more than one of the previously mentioned standards. Turning to FIG. 1, an example of a convention multi-standard buffer 100 can be seen. As shown, this buffer 100 generally comprises an LVDS buffer 102, an HCSL buffer 104, an LVCMOS buffer 106, and a CML buffer 108. Each of these buffers 102, 104, 106, and 108 receive the input signal IN and can be enabled, respectively, by enable signals SNLVDS, ENHCSL, ENLVCMOS, and ENCML. Based on these enable signals SNLVDS, ENHCSL, ENLVCMOS, and ENCML, the appropriate buffer 102, 104, 106, or 108 can be enabled or activated. A problem with this configuration, however, is that a considerable amount of area is wasted. Therefore there is a need for an improved multi-standard buffer.

Some other conventional circuits are: U.S. Pat. No. 7,598,779; U.S. Patent Pre-Grant Publ. No. 2007/0024320; and U.S. Patent Pre-Grant Publ. No. 2003/0193350.

SUMMARY

It is an object of the invention to provide an electronic device with a configurable buffer that can be configured to provide output signals according to different standards, requires less chip area and consumes less power than prior art solutions.

Accordingly, an electronic device is provided which comprises a buffer that is configurable for different operation modes. The buffer comprises a first switch and a second switch which are coupled in series at a first output node. The buffer further comprises a third switch and a fourth switch which are coupled in series at a second output node. There is further a first current source and a second current source. The first current source is coupled with one side to the first switch and the third switch and with another side to a first supply voltage. The second current source is coupled with one side to the second switch and the fourth switch and with a second side to a second supply voltage. The first current source is configured to supply a variable current in order to adjust an output swing in a first operation mode and in a second operation mode. The second current source is configured to supply a variable current in order to adjust a common mode voltage level of the output signal in the first operation mode. The second current source can be switched off (disconnected) in the second operation mode. Accordingly, two different operation modes can be performed by adjusting the two current sources. This is a very efficient way of adjusting the buffer without increasing substantially the chip area and complexity of the circuit.

In a further aspect of the invention, there is third operation mode. The electronic device or more specifically the buffer can then be configured to comply with the third operation mode The first current source is then advantageously further configured to provide controlled series resistance in the third operation mode. The second current source can be configured to provide controlled series resistance in the third operation mode. In an embodiment, the controlled series resistance can be set to a minimum (connected, switched on) in the third operation mode.

According to an aspect of the invention, the electronic device or more specifically the buffer can be configured to comply with a fourth operation mode. In this fourth operation mode, the first current source is set to a maximum series resistance (switched off, disconnected) and the second current source supplies a constant current (for example through a current mirror configuration).

Furthermore, the first current source and the second current source can be transistors. The control gates of these transistors can be coupled to receive variable voltage levels in order to adjust the rise and/or fall time of the signals at the first and second output node. This provides a very compact and efficient way of adjusting the rise and fall times of the configurable buffer.

According to an aspect of the invention, a duty cycle correction circuit (DCC) may be provided in the electronic device. The duty cycle correction circuit can be configured to optimize the duty cycle of the input signal or input signals present at the input of the buffer over process, voltage and/or temperature variations. The duty cycle correction circuit may further be configured to optimize the duty cycle over process, voltage and/or temperature variations for the input signal at the control gates of the first and second as well as the third and fourth transistor. In an embodiment of the invention, two duty cycle correction stages may be provided, one of which optimizes the duty cycle for the input signal present at the control gates of the first and second transistor (first and second switch) and the third and fourth transistor (third and fourth switches), respectively.

The first, second, third and fourth switch are preferable high-speed CMOS transistors. The first and the third switch may be PMOS transistors and the second and fourth switch may be NMOS transistors. The first and second switch form a first branch of the buffer and the third and fourth switch form a second branch. The switching is performed by applying respective input signals (i.e. the buffer input signals) to the control gates of the transistors (being used as the switches).

The control gate of the first and second transistor may receive the same first input signal. The control gates of the third and fourth transistor may also receive the same second input signal. The first and the second input signal may then be the two symmetric signals of a differential input signal. The output signals of the buffer is then present at the first output node and the second output or for the differential configuration between the first output node and the second output node.

According to an aspect of the invention, two resistors are coupled in series between the first output node and the second output node. This provides a common feedback node between the two resistors for determining the feedback voltage level of the voltage drop between the first output node and the second output node. The common mode voltage level may then be used in a feedback loop for adjusting the common mode voltage level of the output signal by adjusting the current supplied by the second current source.

This aspect of the invention provides that the common voltage level can be easily adjusted for operation modes in which the common mode voltage level is crucial.

The buffer according to the invention is advantageously configurable in four different operation modes. The first mode may be one which is referred to as low voltage differential swing (LVDS), the second operation mode may be referred to as high current steering logic (HCSL) mode, the third operation mode may be referred to as low voltage CMOS (LVCMOS) mode and the fourth operation mode may be referred to as current switch mode logic (CML) mode. The buffer according to the invention may then be configured in accordance with the respective requirements of standards relating to LVDS, HCSL, CML and LVCMOS.

LVDS is the acronym for low-voltage differential signaling, which is an electrical signaling system that can run at very high speeds over inexpensive twisted-pair cables. The corresponding standard is defined in ANSI/TIA/EIA-644-1995. LVDS uses a voltage difference between two wires to encode information. These two wires are supposed to be connected to the first output node and the second output node of the buffer. The buffer is then configured to inject a small current, as for example 3.5 mA into one wire or the other depending on the logic level to be sent. The current passes through a resistor of about 100 to 120Ω (matched to the impedance of the cable) at the receiving end and then returns in the opposite direction along the other wire. The voltage difference across the resistor is therefore assumed to be 350 mV. The common mode voltage level is at about 1.25 V. Voltage levels below 1 V are determined as logic low and voltage levels above 1.4 V are logic high. Supply voltage levels of about 2.5 to 3.3 V may be used.

HCSL is another standard that typically requires that the buffer drives the cable with a current of 15 mA. A switched current source is provided that is terminated to ground through a 50Ω resistor. The nominal swing is 750 mV. The HCSL interface is typically source-terminated with a 50Ω load. The open drain transistor at the output has a rather high impedance in the range of several kilo-ohms.

The third operation mode is referred to as low-voltage complementary metal oxide semiconductor (LVCMOS) standard. The acronym LVCMOS generally relates to a low-voltage class of CMOS technology integrated circuits. The driving requirements for the respective buffers are defined in various standards of the Joint Electron Devices Engineering Council JEDEC for 3.3, 3.0, 2.5, 1.5, 1.2 and 1.0 V.

The CML-mode is quite similar to the HCSL-mode. In CML-mode, the buffer is configured in a mirrored configuration compared with HCSL-mode.

The buffer according to the invention is advantageously configured to comply with the requirements of the previously identified standards LVDS, HCSL, CML and LVCMOS.

In an embodiment of the invention, an operational amplifier may be provided which may be configured to control the current through the first current source. This operational amplifier may advantageously be configured to perform the control of the current through the first current source in the first operation mode and in the second operation mode.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF EMBODIMENTS

Figure 1:
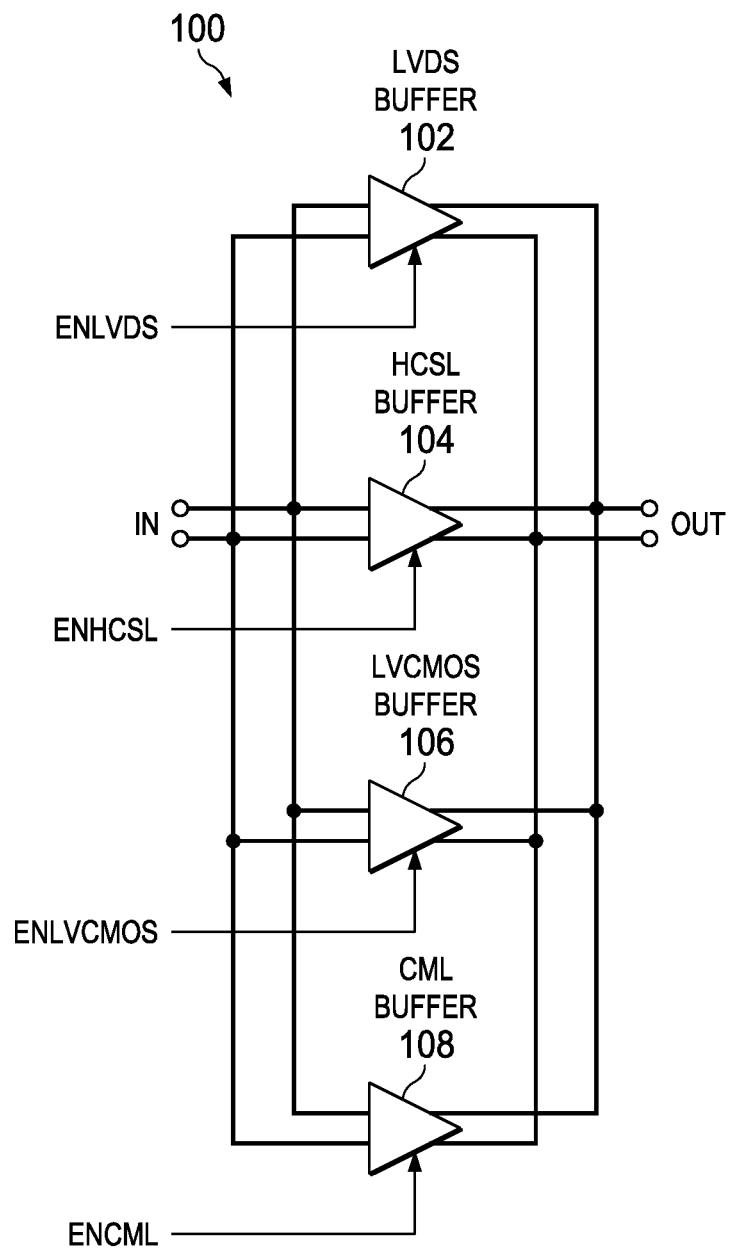
FIG. 1 shows a circuit diagram of an example of a conventional multi-standard buffer.

Refer now to the drawings wherein depicted elements are, for the sake of clarity, not necessarily shown to scale and wherein like or similar elements are designated by the same reference numeral through the several views.

Figure 2:
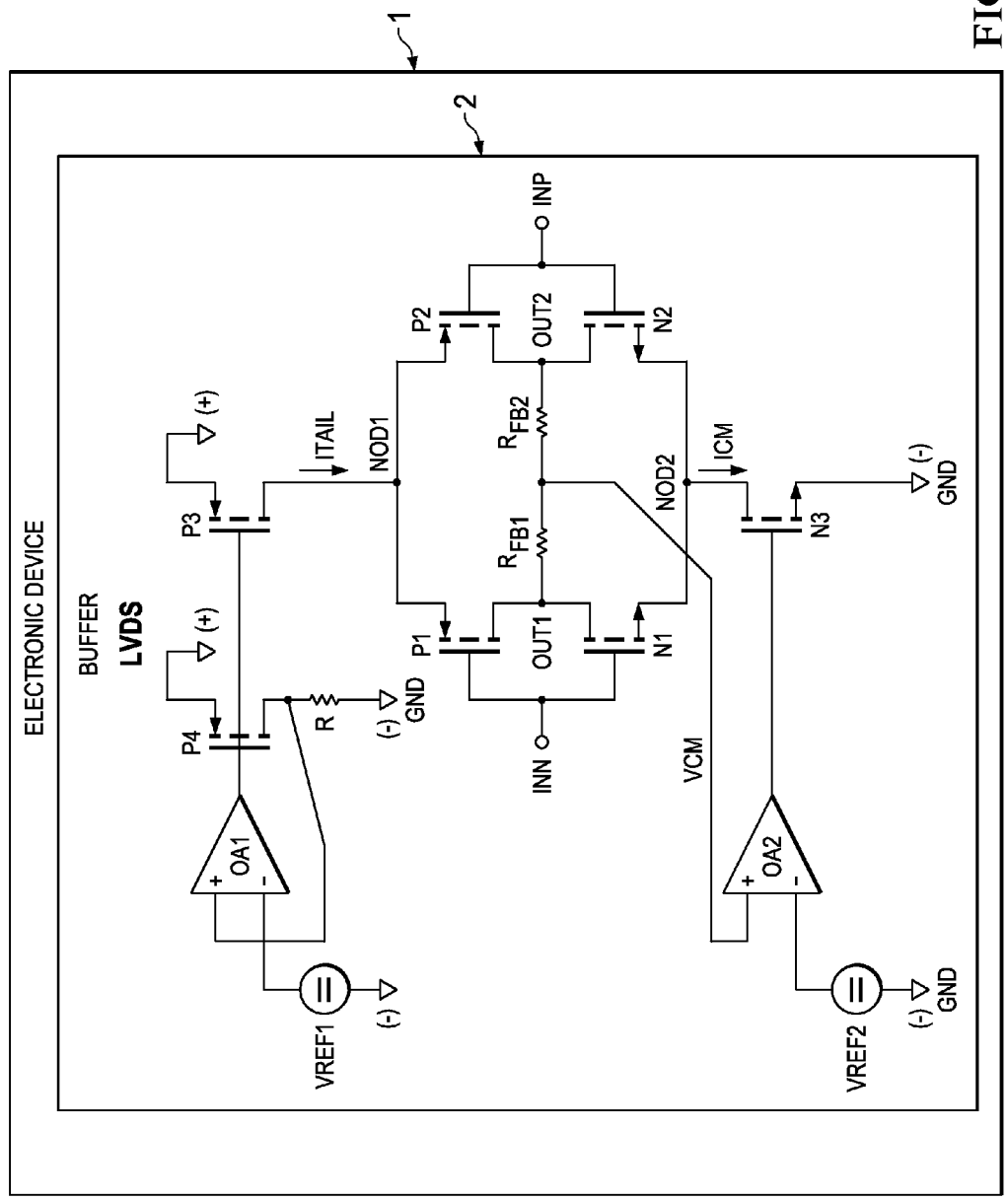
FIG. 2 shows a circuit diagram of an example of a multi-standard buffer in accordance with an embodiment of the present invention in LVDS-mode.

The buffer 2 according to the invention is configured to comply with the standards LVDS, HCSL, LVCMOS and CML. FIGS. 2 to 5 show separately the individual configurations for each of the standards. FIG. 2 shows a simplified circuit diagram of an embodiment of the invention. There is an electronic device 1 including a buffer 2 which is configured according to aspects of the invention. FIG. 2 relates to the buffer being configured for LVDS. The buffer according to the invention includes four switches P1, P2, N1 and N2. These switches are typically high speed CMOS-transistors. P1 and P2 may be high speed-PMOS-transistors and N1 and N2 may be high speed NMOS-transistors. The channels of transistors P1 and N1 are coupled in series. P1 and N1 are coupled at their drains. The channels of transistors P2 and N2 are also coupled in series. The drains of transistor P2 and N2 are coupled together. The node between the drains of transistors P1 and N1 is the first output node OUT1 and the node between the drains of transistor P2 and N2 is the second output node OUT2 of the buffer 2.

The sources of transistor P1 and P2 are also coupled together at node NOD1. The sources of transistors N1 and N2 are coupled together at node NOD2. There are two current sources P3 and N3. The first current source P3 is a PMOS-transistor which is configured to provide a tail current ITAIL to the two branches of the buffer provided by the series of P1 and N1 as well as P2 and N2. The second current source N3 is an NMOS-transistor, which is configured to draw a common mode current ICM from the sources (NOD2) of transistors N1 and N2.

The buffer 2 can generate two full single ended output signals at output nodes OUT1 and OUT2 or a differential output signal between the two nodes OUT1 and OUT2 dependent on the configuration of the buffer and the required standard and in response to the input signals INN and INP. Input signal INN is applied to the control gates of switches P1 and N1. Input signal INP is applied to the control gates of switches P2 and N2. Signal INN and INP can be the two symmetric components of a fully differential input signal.

Two feedback resistors RFB1, RFB2 are coupled in series between the first output node OUT1 and the second output node OUT2. The two feedback resistors RFB1 and RFB2 are matched (i.e. they have the same resistance value and the layouts are similar). A common mode sensing voltage VCM can then be tapped from the node between RFB1 and RFB2 and fed to the positive input of an operational amplifier OA2. The negative input of the operational amplifier OA2 receives a reference voltage VREF2. The output of operational amplifier OA2 is fed to the control gate of the second current source (transistor N3). Accordingly, resistors RFB1, RFB2, operational amplifier OA2 and current source N3 provide a feedback loop that adjusts and stabilizes the common mode output voltage level VCM of the differential voltage between the first output node OUT1 and the second output node OUT2.

There is a further PMOS-transistor P4 which receives the same gate voltage as the first current source (transistor P3). Accordingly, the current through transistor P4 is a replica proportional to the current through P3, which is the tail current ITAIL that is fed to the two branches of the buffer (at NOD1). The current through P4 can be much smaller, for example by a factor n (mirror factor) than the current through P3.

The voltage level at the control gate of the first current source (transistor P3) and transistor P4 is established and controlled with another operational amplifier OA1. This operational amplifier OA1 is coupled with its positive input to the drain of transistor P4. A resistor R is coupled between the drain of P4 and ground. The source of transistor P4 is coupled to supply voltage AVDD. The source of transistor P3 is also coupled to AVDD. The negative input of operational amplifier OA1 receives the reference voltage VREF1. The feedback loop including operational amplifier OA1, transistor P4 and resistor R provides that the voltage-drop across resistor R due to a replica current is proportional to transistor P3's drain current. This voltage is fed to the positive input of operational amplifier OA1 and is equivalent to the reference voltage VREF1. This provides that the drain current of transistor P3 (the current ITAIL supplied by the first current source P3) is controlled such that the required output voltage swing for the LVDS standard is generated. One advantage of the shown circuit is that the whole current ITAIL is supplied to the external load resistor (for LVDS defined to be 100Ω), which are differentially connected at the buffer outputs OUT1 and OUT2, which generates full output swing with a comparatively low current consumption.

Figure 3:
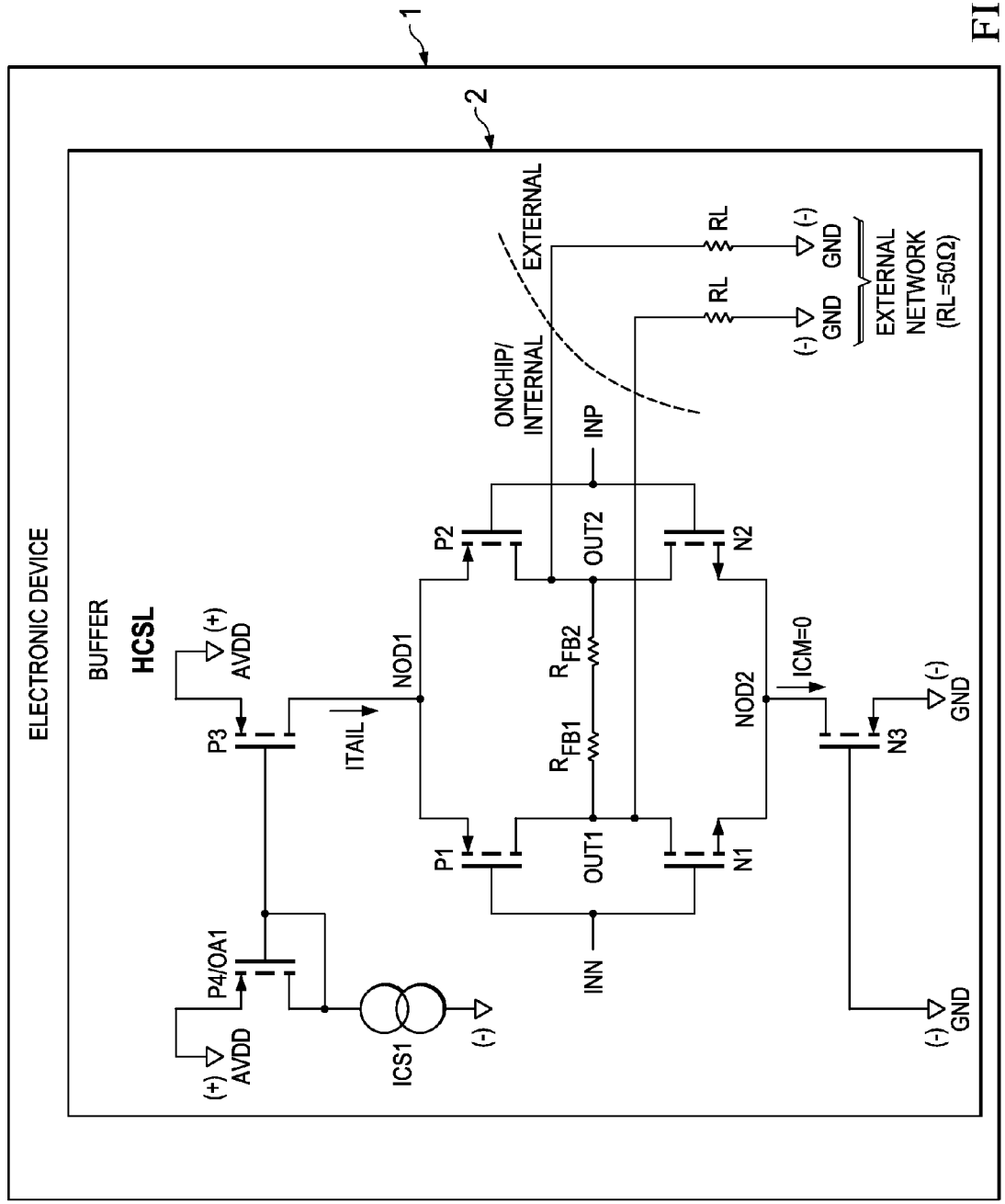
FIG. 3 shows a circuit diagram of an example of a multi-standard buffer in accordance with an embodiment of the present invention in HCSL-mode.

FIG. 3 shows the electronic device 1 with the buffer 2 in the configuration relating to the HCSL standard. The components shown in FIG. 2, which relate to the LVDS-standard, are not shown in FIG. 3. However, the buffer 2 is the same buffer 2 as the one shown in FIG. 2 and the additional parts and stages shown in FIG. 2 can be assumed to be also present in FIG. 3.

In order to configure the buffer 2 shown in FIG. 2 for the HCSL standard, the NMOS-transistor N3 (second current source) is switched off. This is performed by coupling the control gate of transistor N3 to ground. For example, this can be accomplished by electronically shortening the gate of N3 to ground GND. The drain current of PMOS-transistor P3 (first current source) is controlled such that the correct voltage swing is generated at the external 50Ω resistors RL, which are connected in a single ended configuration to the output nodes OUT1 and OUT2.

Transistors P4 and P3 form a current mirror. The control gates of transistors P4 and P3 are coupled together. The control gates of transistors P3 and P4 are also coupled to the drain of P4 (current mirror configuration). There is a current source ICS1 coupled to the drain of P4, which defines the current ITAIL at the drain of P3, which is supplied to the buffer (NOD1). A certain mirroring factor n may be implemented in order to reduce the current through P4 (current ICS1) by a factor n with respect to the current ITAIL.

Since the second current source (transistor N3) is switched off, the common mode current ICM is zero. The whole current ITAIL is therefore supplied to the load resistors RL dependent on the input signals INN and INP which are present at the control gates of P1, N1 and P2, N2 respectively. In this configuration, no common mode feedback loop is required.

Figure 4:
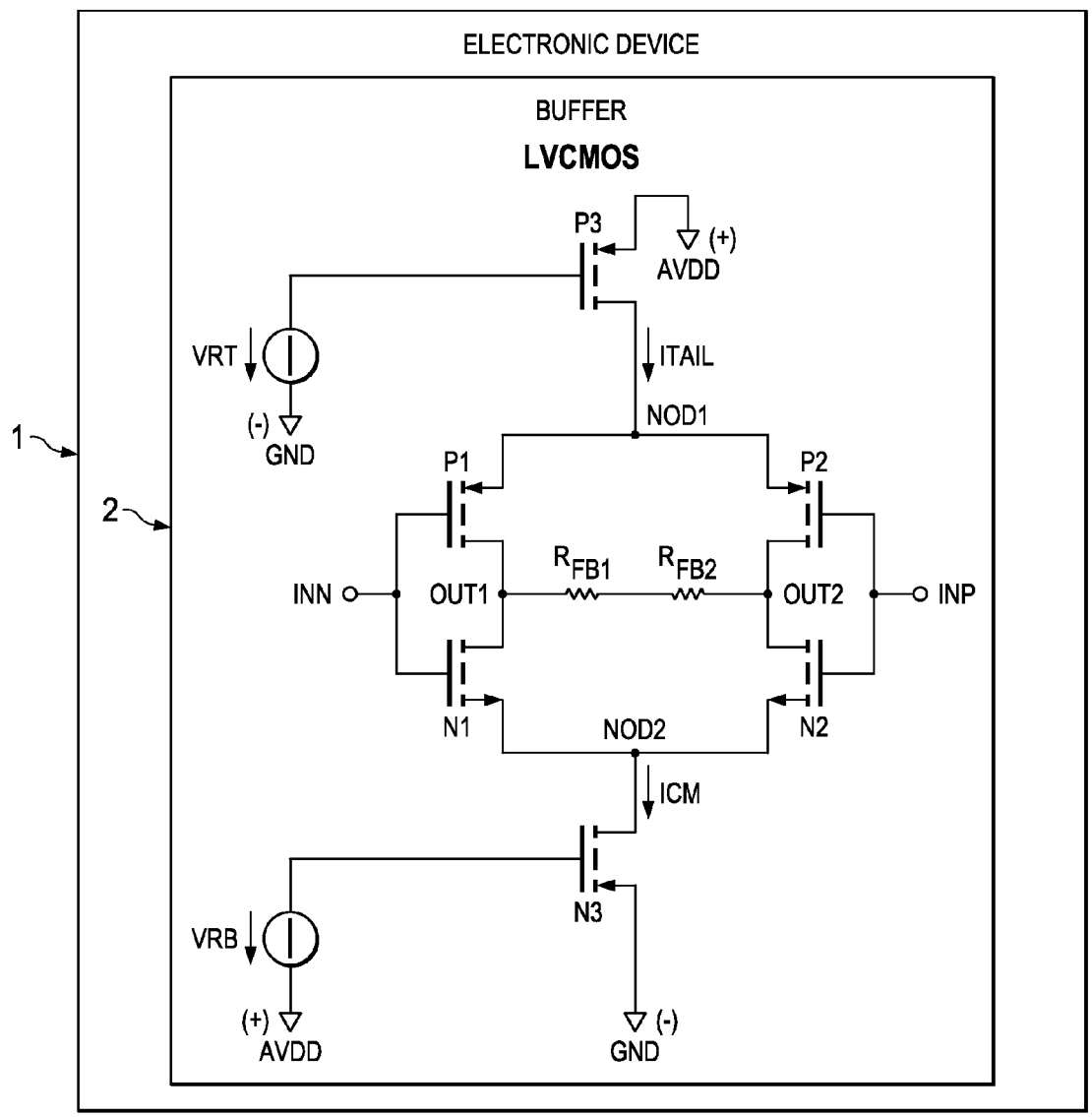
FIG. 4 shows a circuit diagram of an example of a multi-standard buffer in accordance with an embodiment of the present invention in LVCMOS-mode.

FIG. 4 shows a simplified circuit diagram of the electronic device 1 and more specifically the buffer 2, which is configured for LVCMOS-mode. Buffer 2 is the same as the one shown in FIGS. 3 and 2. However, parts and components not necessary for the LVCMOS-mode are not shown in FIG. 4. FIG. 4 illustrates how the buffer 2 of FIG. 2 and FIG. 3 can be configured in order to comply with LVCMOS-mode.

LVCMOS-mode requires a rail-to-rail output buffer. The gate of P3 (second control gate of first current source) is electronically shorted to ground. The gate of the second current source (transistor N3) is shorted to supply voltage AVDD. This means that VRT and VRB are both zero. Therefore, transistors P3 and N3 are in low ohmic-mode and represent closed switches (connected), which have a minimum on-resistance (RDSON). Accordingly, in LVCMOS-mode, the buffer 2 generates a full single ended output signal at output nodes OUT1 and OUT2 in response to the input signals INN and INP. The output signals at nodes OUT1 and OUT2 swing between ground GND and supply voltage level AVDD.

According to an aspect of the invention, the rise and/or fall time of the buffer 2 can be varied by adjusting the impedance of transistors N3 and/or P3. This can be performed by supplying predefined voltage levels VRT and VRB to the control gates of transistors P3 and N3. This means that the voltage levels VRT and VRB at the control gates of P3 and N3 can be set to values different from zero.

Figure 5:
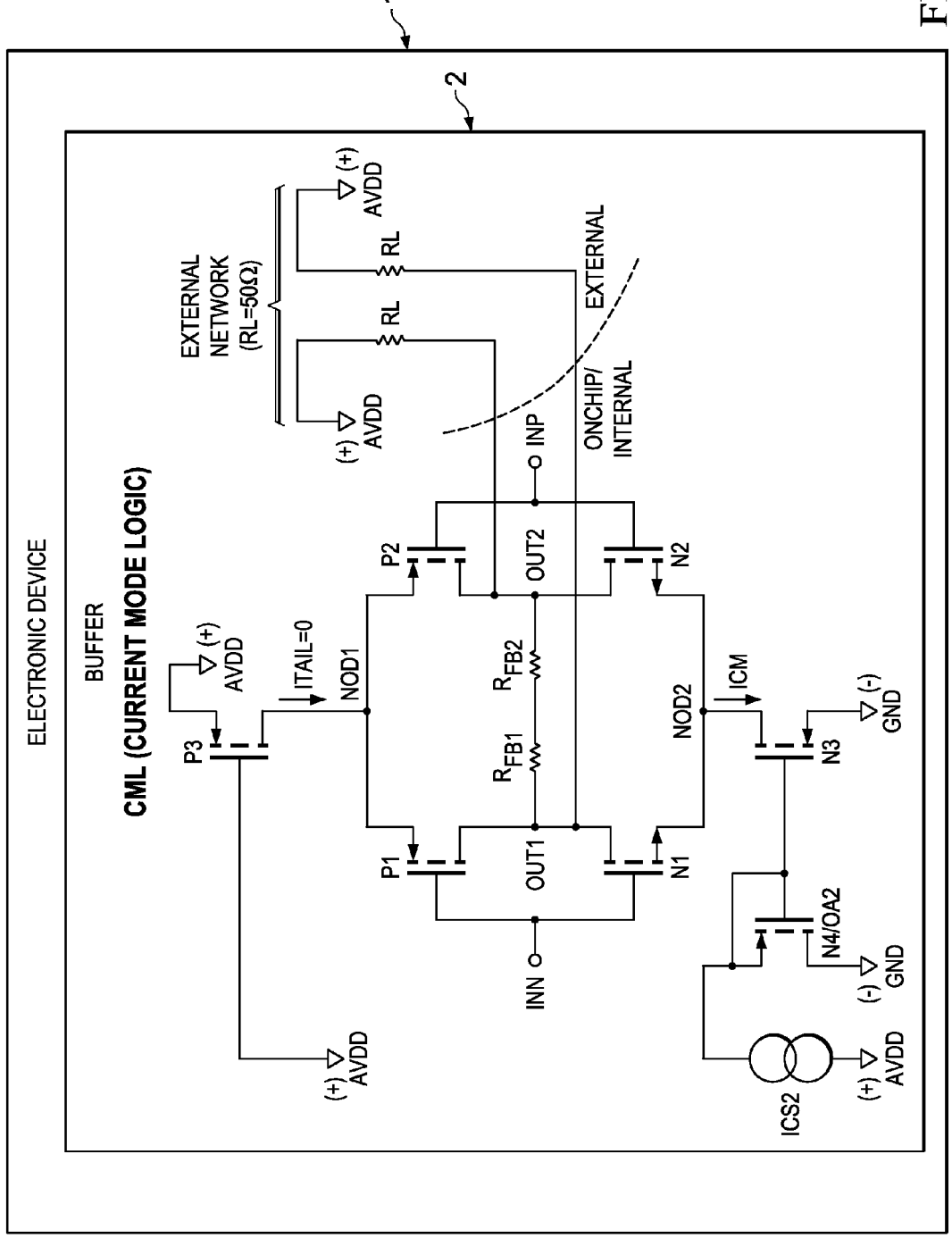
FIG. 5 shows a circuit diagram of an example of a multi-standard buffer in accordance with an embodiment of the present invention in CML-mode.

FIG. 5 shows the electronic device 1 with the buffer 2 in the configuration relating to CML standard or CML-mode. The components shown in FIG. 2, FIG. 3 and FIG. 4, which relate to the other operation modes are partially not shown in FIG. 5. However, the buffer 2 is the same buffer 2 as the one shown in the other figures and the additional parts and stages not shown in FIG. 5 can be assumed to be also present in FIG. 5.

In order to configure the buffer 2 shown in FIG. 5 for the CML standard, the PMOS transistor P3 (first current source) is switched off. This is performed by coupling the control gate of transistor P3 to power supply voltage level AVDD. This can be accomplished by electronically shortening the gate of P3 to AVDD. The drain current of NMOS transistor N3 (second current source) is controlled such that the correct voltage swing is generated at the external 50Ω resistors RL, which are connected in a single ended configuration to the output nodes OUT1 and OUT2. RL and ICM can be set to other values as well, depending on the required swing and driving strength.

Transistors N4 and N3 form a current mirror. The control gates of transistors N4 and N3 are coupled together. The control gates of transistors N3 and N4 are also coupled to the drain of N4 (current mirror configuration). There is a current source ICS2 coupled to the drain of N4, which defines the current ICM at the drain of N3, which is supplied to the buffer (NOD2). A certain mirroring factor n may be implemented in order to reduce the current through N4 (current ICS2) by a factor n with respect to the current ICM.

Since the first current source (transistor P3) is switched off, the tail current ITAIL is zero. The whole current ICM is therefore supplied to the load resistors RL dependent on the input signals INN and INP which are present at the control gates of P1, N1 and P2, N2, respectively. In this configuration, no common mode feedback loop is required.

Figure 6:
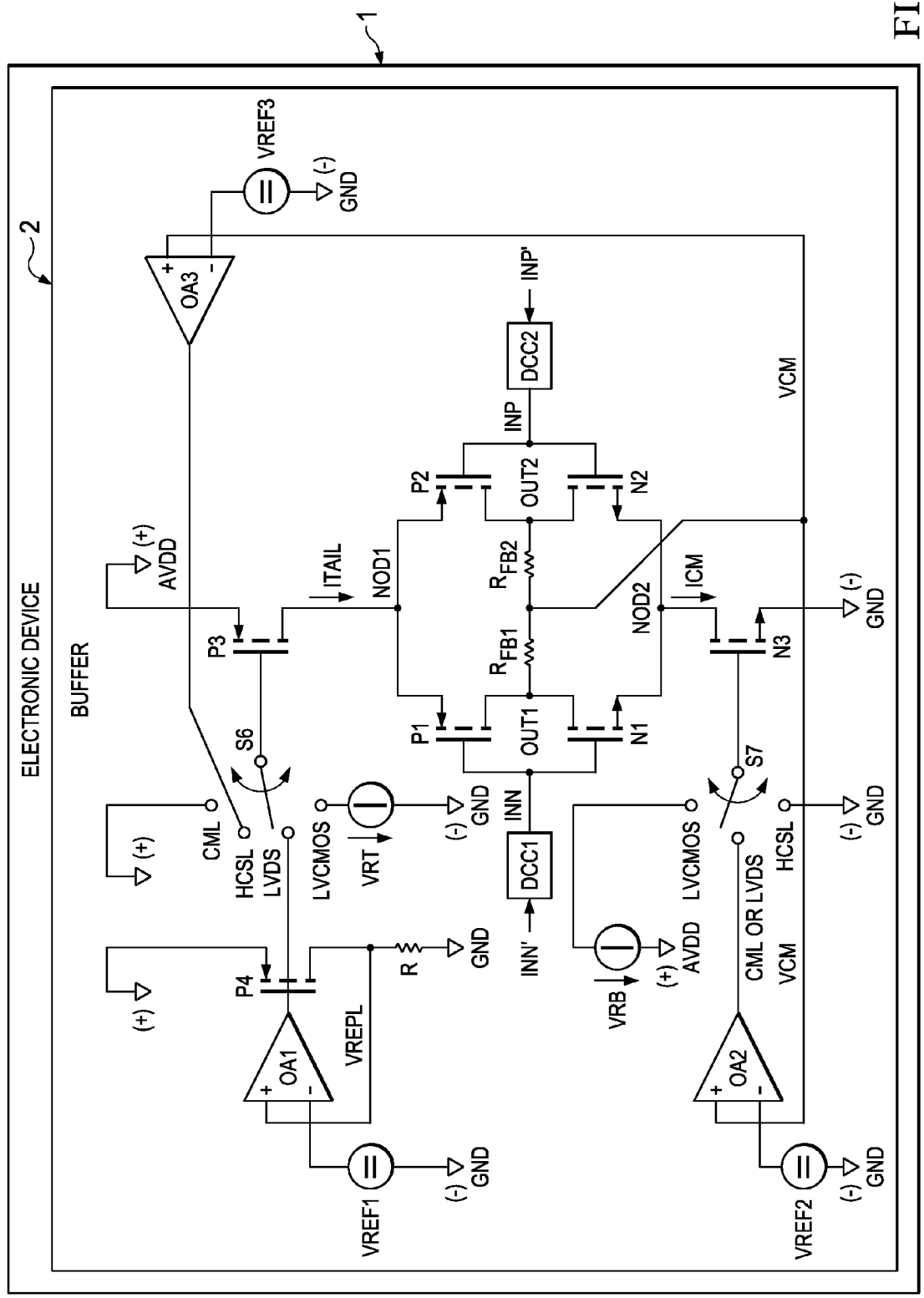
FIGS. 6 and 7 shows circuit diagrams of examples of a multi-standard buffer in accordance with an embodiment of the present invention that can be configured to operate in the modes depicted in FIGS. 2-5.

FIG. 6 shows a more detailed simplified circuit diagram of an embodiment of the invention. The electronic device 1 includes the buffer 2, which is configurable in order to comply with the LVDS standard, HCSL standard, LVCMOS standard and CML standard. The buffer 2 is similar to the buffer 2 shown in FIG. 2, FIG. 3, FIG. 4 and FIG. 5. The buffer 2 basically comprises transistors P1, N1, P2 and N2 as well as transistors P3 and N3 configured as current sources and some further switches, components and stages in order to implement the four configurations shown in FIG. 2, FIG. 3, FIG. 4 and FIG. 5.

Accordingly, there is the feedback loop including operational amplifier OA1, transistor P4 and resistor R. The gate of transistor P3 can be connected to the gate of transistor P4. The gates of transistors P3 and P4 are then connected to the output of the operational amplifier OA1. The positive input of the operational amplifier OA1 is coupled between the drain of transistor P4 and the resistor R. The negative input is coupled to a voltage source VREF1 in order to receive a reference voltage. The voltage level VREPL at the positive input of the operational amplifier OA1 defines the currents through P4 and P3. With switches S5 and S6, the gate of P3 may either be switched to P4 for the LVDS configuration shown in FIG. 2 or to GND or to the output of operational amplifier OA3 or the output of operational amplifier OA1. The operational amplifier OA3 establishes the current through P3 necessary for HCSL-mode. The positive input of operational amplifier OA3 is coupled to receive the common mode feedback voltage VCM from the node between the two resistors RFB1 and RFB2. The negative input of operational amplifier OA2 is coupled to a reference voltage source VREF2 for receiving a reference voltage level. The negative input of operational amplifier OA3 is coupled to a reference voltage source VREF3 for receiving a reference voltage level for HCSL-mode. The positive input of operational amplifier OA2 also receives the common mode feedback voltage level VCM, i.e.

the positive input of operational amplifier OA2 is coupled to the node between RFB1 and RFB2. The operational amplifier OA1 (the loop implemented with operational amplifier OA1, transistor P4 and resistor R) establishes the current through P3 for LVDS-mode. The common mode feedback loop is implemented by operational amplifier OA2 which receives the common mode voltage VCM from the resistive divider RFB1, RFB2. A switch S7 either connects the control gate of N3 to the output of operational amplifier OA2 for LVDS-mode or CML-mode, or to ground GND for HCSL-mode or to AVDD or an adjustable voltage VRB for LVCMOS-mode.

Switch S6 connects either to ground or a predetermined voltage level VRT for determining the rise and fall time of the buffer for LVCMOS-mode, to the output of operational amplifier OA1 for LVDS-mode, to the output of operational amplifier OA3 for HCSL-mode or to supply voltage level AVDD for CML-mode. The four different configurations for LVDS, HSCL, LVCMOS and CML are summarized in the Table 1 as follows.

TABLE 1

| Mode | S6 | S7 |
|---|---|---|
| LVDS | OA1-OUT | OA2-OUT |
| HCSL | OA3-OUT | GND |
| LVCMOS | GND/VRT | AVDD/VRB |
| CML | AVDD | OA2-OUT |

The two voltage sources VRT and VRB are optional and serve to adjust the rise and fall time of the buffer. This is a very compact and efficient way of adjusting the rise and fall times for LVCMOS-mode.

There are also two duty cycle correction stages DCC1 and DCC2. Each of the duty cycle correction stages serves to adjust the duty cycle of the input signal INN and INP, respectively. The input signal INN' is passed through duty cycle correction stage DCC1 in order to adjust the duty cycle of the input signal which is then fed as INN to the control gates of P1 and N1. The input signal INP' is passed through duty cycle correction stage DCC2 which is then applied to the control gates of transistors P2 and N2 as input signal INP. This is necessary in order to provide duty cycle correction for LVCMOS-mode, when the buffer is used in single ended/differential and/or in-face-differential-face configuration. In the LVCMOS-mode, the duty cycle correction stages DCC1 and DCC2 optimize the input clock duty cycle for each side (P1, N1 and P2, N2), individually. The supply voltage AVDD can range from 1.7 V to 3.7 V. The common mode voltage for LVDS-mode is 900 mV for 1.8 V and 1.2 V for 2.3 to 3.7 V supply voltage.

Figure 7:
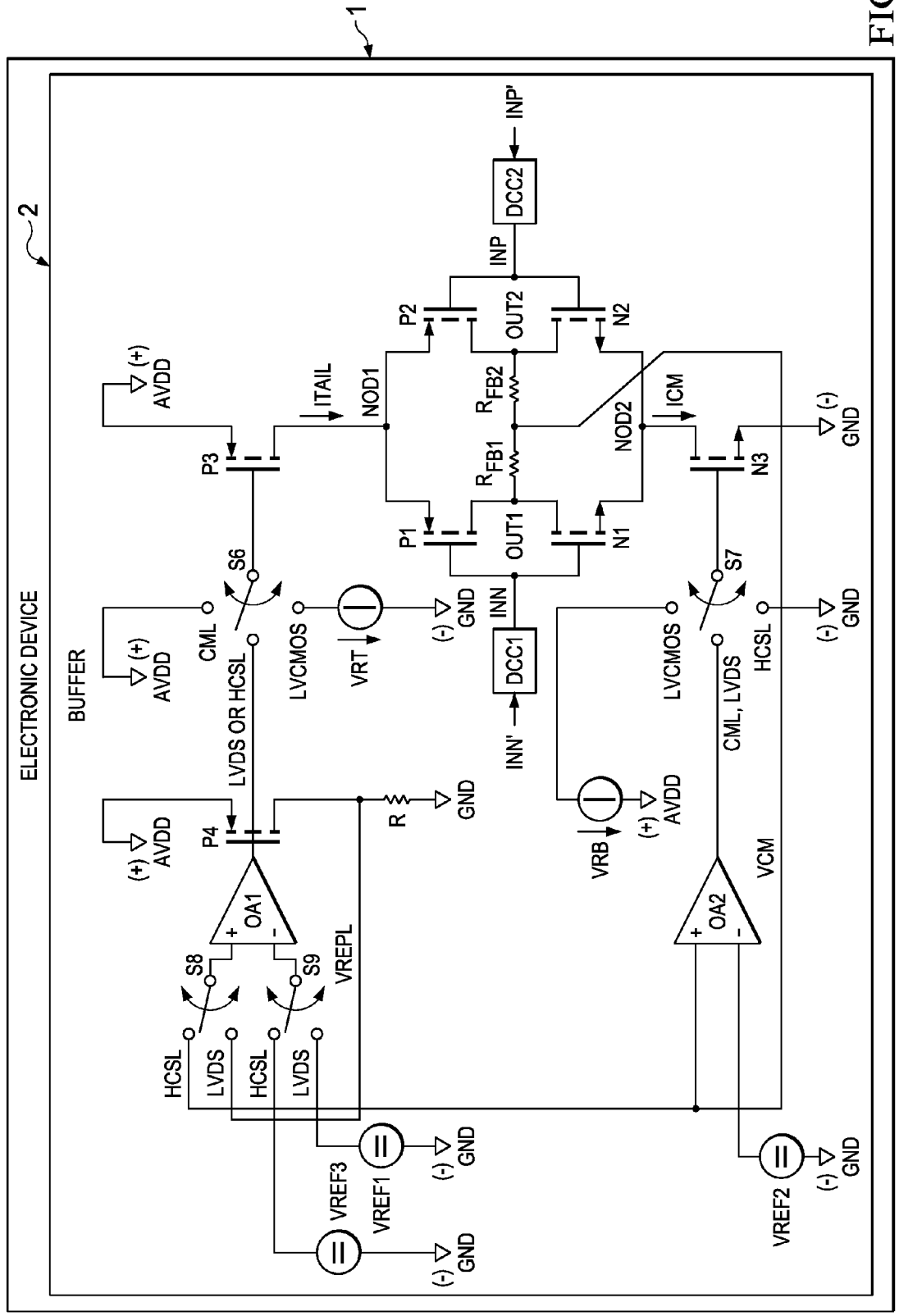

FIG. 7 shows a simplified circuit diagram of another embodiment of the invention. The electronic device includes buffer 2, which is basically similar to the buffer described with respect to FIG. 2 to FIG. 6. However, compared with FIG. 6, the tail current ITAIL provided by transistor P3 is now adjusted with a single operational amplifier OA1. The operational amplifier OA3 shown in FIG. 6 may then be omitted. The following table TABLE 2 shows the configuration of switches S6, S7, S8 and S9 in order to configure the buffer 2 for the four different operation modes LVDS, HCSL, LVCMOS and CML.

TABLE 2

| Mode | S6 | S7 | S8 | S9 |
|------|------|------|------|------|
| LVDS | OA1-OUT | OA2-OUT | VREPL | VREF1 |
| HCSL | OA3-OUT | GND | VCM | VREF3 |
| LVCMOS | GND/VRT | AVDD/VRB | X | X |
| CML | AVDD | OA2-OUT | X | X |

In the Table "X" means that this signal is not relevant for the operation according to the specific operation mode.

The positive input of operational amplifier OA1 either receives the voltage present between transistor P4 and resistor R (referred to as VREPL) or the common mode voltage VCM which is tapped between resistors RFB1 and RFB2 as shown in FIG. 2 to FIG. 6. The negative input of operational amplifier OA1 is switched by switch S9 between the reference voltage VREF3 for HCSL-mode and the reference voltage VREF1 for LVDS-mode. Switch S6 either connects the control gate of P3 with the control gate of P4 and the output of operational amplifier OA1 for LVDS-mode and HCSL-mode or to ground for LVCMOS-mode or to AVDD for CML-mode. In an embodiment, there can be a variable voltage source VRT for providing a predefined voltage level at the gate of P3 in order to adjust the rise and fall time of the buffer 2. If the positive input of operational amplifier OA1 is connected to the drain of P4, the buffer is configured for LVDS-mode. If the positive input is switched to receive VCM, it is configured for HCSL-mode. The mirror factor between P4 and P3 can be 1:N. N is advantageously greater than 1. The control gate of transistor N3 is controlled as already described with respect to FIG. 6. Accordingly, the control gate of N3 is either switched to ground for HCSL-mode, to the output of operational amplifier OA2 for LVDS-mode or CML-mode or to AVDD or an adjustable voltage VRB for LVCMOS-mode. The adjustable voltage VRB is used in order to adjust rise and fall times of the buffer 2. The positive input of operational amplifier OA2 receives the common mode voltage VCM and the negative input of operational amplifier OA2 is coupled to reference voltage source VREF2.

Figure 8:
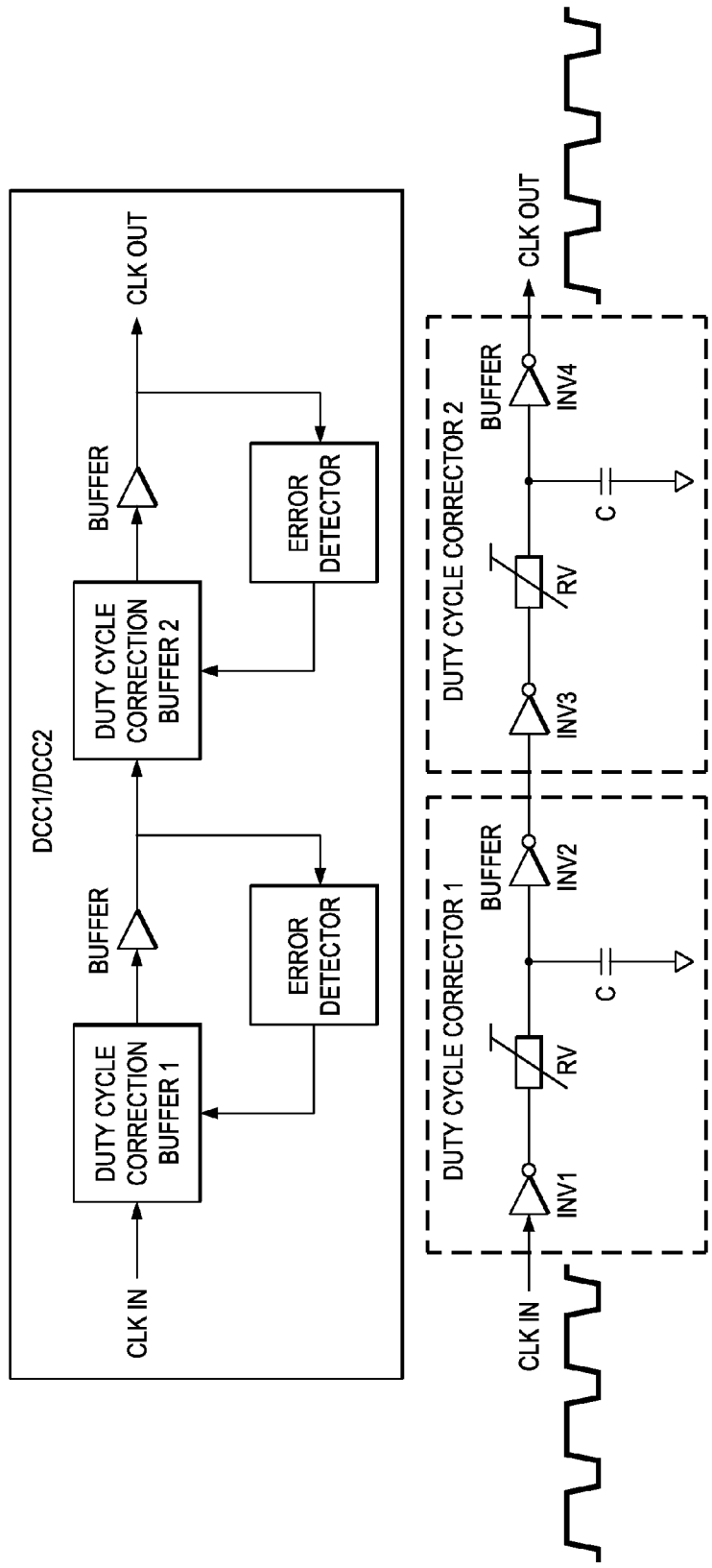
FIG. 8 shows block and circuit diagrams of an example of a duty cycle correction circuit of FIGS. 6 and 7.

FIG. 8 shows a simplified block and circuit diagram of the duty cycle correction stages DCC1 and DCC2 shown in FIG. 6 and FIG. 7. Accordingly, the duty cycle correction stages DCC1 and DCC2 can be implemented as shown in the upper part of FIG. 8. The input clock signals (INN' and INP') are fed to a duty cycle correction buffer 1 and then to a further buffer. The output signal of the buffer is then fed back through an error detector and the duty cycle correction buffer 1 is adjusted. A second stage which is similar to a second duty cycle correction stage (duty cycle corrector 2) is implemented similarly to the first duty cycle correction stage (duty cycle corrector 1). The output of the first stage is passed to the second stage. The output signal CLKOUT (INN, INP in FIG. 6 and FIG. 7) can then be passed to the buffer. The first duty cycle correction stage can be implemented with a first inverter INV1, an adjustable resistor RV, a capacitor C and another inverter INV2. The input of INV1 receives the input clock signal and passes the signal to the adjustable resistor RV which is coupled to the capacitor C. The node between resistor RV and capacitor C is coupled to the input of the second inverter INV2. The output of the second inverter INV2 is coupled to the second duty cycle correction stage. There is a further duty cycle correction stage. This further duty cycle correction stage includes inverter INV3, another variable resistor RV and another capacitor C as well as another inverter INV4. The components of the second duty cycle correction stage are coupled in a similar manner as those of the first duty cycle correction stage.

Having thus described the invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the invention may be employed without a corresponding use of the other features. Accordingly, it is appropriate that the appended claims be construed broadly and in a manner consistent with the scope of the invention.

The invention claimed is:

1. An electronic device comprising
a buffer, the buffer having a first switch and a second switch coupled in series at a first output node,
a third switch and a fourth switch coupled in series at a second output node,
a first current source and a second current source, wherein
the first current source is coupled with one side to the first switch and the third switch and with another side to a first supply voltage,
the second current source is coupled with one side to the second switch and the fourth switch and with a second side to a second supply voltage, and
the first current source is configured to adjust an output swing in a first operation mode and in a second operation mode, and
the second current source is configured to adjust a common mode voltage level of the output signal in the first operation mode and to provide maximum series resistance in the second operation mode,
wherein the first current source and the second current source are configured to provide controlled series resistance in a third operation mode, and
wherein the first current source and the second current source are transistors, the control gates of which are coupled to receive variable voltage levels in order to control the series resistance of the transistors in the third operation mode so as to adjust the rise and/or fall time of the signals at the first and second output node.

2. The electronic device according to claim 1, wherein the first current source is configured to provide maximum series resistance and the second current source is configured to provide controlled series resistance in a fourth operation mode.

3. The electronic device according to claim 1 further comprising a duty cycle correction circuit configured to optimize the duty cycle of a buffer input signal over process, voltage and/or temperature variations.

4. The electronic device according to claim 3, further comprising a duty cycle correction circuit configured to individually optimize the duty cycle over process, voltage and/or temperature variations for the input signals in the third mode.

5. The electronic device according to claim 4, further comprising two resistors coupled in series between the first output node and the second output node for providing a common mode feedback node between the two resistors.

6. The electronic device according to claim 5, wherein the buffer is configurable as a buffer in accordance with a LVDS standard in the first mode.

7. The electronic device according to claim 6, wherein the buffer is configurable as a buffer in accordance with a HCSL standard in the second mode.

8. The electronic device according to claim 7, wherein the buffer is configurable as a buffer in accordance with a LVCMOS standard in the third mode.

9. The electronic device according to claim 8, wherein the buffer is configurable as a buffer in accordance with a CML standard in the fourth mode.

10. The electronic device according to claim 9, further comprising an operational amplifier for controlling the current through the first current source in the first and the second mode.

11. An apparatus comprising:
a buffer;
a first control circuit that is coupled to the buffer so as to set a tail current for the buffer; and
a second control circuit that is coupled to the buffer so as to set a common mode current for the buffer, wherein the first and second control circuits have
a first mode,
a second mode,
a third mode, and a fourth mode, and
wherein the tail and common mode currents correspond to the first, second, third, and fourth modes, and wherein, in the first, second, and third modes, the buffer is configured to provide a differential output signal, and wherein, in the fourth mode, the buffer is configured to provide a single-ended output,
wherein the apparatus further comprises first and second supply rails, and wherein the buffer further comprises:
a first transistor that is coupled to the first supply rail and that is coupled to the first control circuit at its control electrode;
a first branch that receives a first input signal and that is coupled to the first transistor;
a second branch that receives a second input signal and that is coupled to the first transistor;
a measurement circuit that is coupled between the first and second branches so as to measure a common mode voltage; and
a second transistor that is coupled to the first and second branches and the second supply rail and that is coupled to the second control circuit at its control electrode.

12. The apparatus of claim 11, wherein the second control circuit further comprises:
an amplifier that is coupled the measurement circuit and that receives a first reference voltage; and
a first switch that is configured to coupled the control electrode of the second transistor to a second reference voltage during the fourth mode, the amplifier during the first and second modes, and the second supply rail during the third mode.

13. The apparatus of claim 12, wherein the amplifier further comprises a first amplifier, and wherein the first control circuit further comprises:
a second amplifier that is coupled to the measurement circuit and that receives a third reference voltage;
a third amplifier that receives a fourth reference voltage;
a third transistor that is coupled to the first supply rail and that is coupled to the third amplifier at its control electrode;
a resistor that is coupled to the third transistor and the second amplifier; and
a second switch that is configured to coupled the control electrode of the first transistor to the third amplifier in the first mode, the first supply rail in the second mode, the second amplifier in the third mode, and a fifth reference voltage in the fourth mode.

14. The apparatus of claim 13, wherein the first and second transistors are PMOS and NMOS transistors, respectively.

15. The apparatus of claim 12, wherein the amplifier further comprises a first amplifier, and wherein the first control circuit further comprises:
a second amplifier;
a third transistor that is coupled to the first supply rail and that is coupled to the third amplifier at its control electrode;
a resistor that is coupled to the third transistor;
a second switch that is configured to couple the second amplifier to the measurement circuit in the third mode and to couple the second amplifier to the resistor in the first mode;
a third switch that is configured to provide a third reference voltage to the second amplifier in the third mode and to provide a fourth reference voltage to the second amplifier in the first mode; and
a fourth switch that is configured to couple the control electrode of the first transistor to the second amplifier in the first and third modes, the first supply rail in the first mode, and a fifth reference voltage in the fourth mode.

16. The apparatus of claim 15, wherein the first and second transistors are PMOS and NMOS transistors, respectively.

* * * * *